United States Patent [19]

Okumura et al.

[11] Patent Number: 4,562,455
[45] Date of Patent: Dec. 31, 1985

[54] SEMICONDUCTOR ELEMENT

[75] Inventors: Katsuya Okumura, Yokohama; Motosuke Miyoshi, Fujisawa, both of Japan

[73] Assignee: Tokyo Shibaura Denki Kabushiki Kaisha, Kawasaki, Japan

[21] Appl. No.: 604,612

[22] Filed: May 2, 1984

Related U.S. Application Data

[63] Continuation of Ser. No. 313,960, Oct. 22, 1981.

[30] Foreign Application Priority Data

Oct. 29, 1980 [JP] Japan ................................. 55-151941

[51] Int. Cl.[4] ...................... H01L 23/48; H01L 29/40
[52] U.S. Cl. ........................................ 357/71; 357/59; 357/65; 357/29
[58] Field of Search ......................... 357/71, 59, 65, 29

[56] References Cited

U.S. PATENT DOCUMENTS

| | | | |
|---|---|---|---|
| 3,585,461 | 1/1971 | Eynon et al. | 357/71 |
| 3,760,242 | 9/1973 | Duffy et al. | 357/54 |
| 3,935,635 | 2/1976 | Botzenhardt | 357/71 |
| 3,936,865 | 2/1976 | Robinson | 357/71 |
| 4,163,678 | 8/1979 | Bube | 357/65 |
| 4,249,193 | 2/1981 | Balyoz et al. | 357/71 |
| 4,270,262 | 6/1981 | Hori et al. | 357/59 |
| 4,278,989 | 7/1981 | Baba et al. | 357/59 |
| 4,381,215 | 4/1983 | Reynolds et al. | 357/71 |

OTHER PUBLICATIONS

*Electronics*, Posa et al., "IEDM Unveils . . . Density", Dec. 6, 1979, vol. 52, No. 25, pp. 124–130.
Wolfgang et al., "Electron . . . Circuits", *IEEE Journal of Solid State Circuits*, vol. SC-14, No. 2, Apr. 1979.

*Primary Examiner*—Martin H. Edlow
*Assistant Examiner*—Jerome Jackson, Jr.
*Attorney, Agent, or Firm*—Finnegan, Henderson, Farabow, Garrett & Dunner

[57] ABSTRACT

A probing pad is formed on a semiconductor element to facilitate measurement by an electron beam tester, for operation analysis or other tests of the semiconductor element. The probing pad is electrically connected to an electro conductive medium from any desired potential measuring section through a contact hole.

3 Claims, 5 Drawing Figures

SEMICONDUCTOR ELEMENT

This application is a continuation of application Ser. No. 313,960, filed Oct. 22, 1981.

BACKGROUND OF THE INVENTION

This invention relates to a semiconductor element which permits easy performance of a test such as an operation checking, as well as an operation analysis and fault analysis.

As generally known, semiconductor elements are subjected to a test or an operation analysis or a fault analysis after manufacturing. With the advent of high density semiconductor elements such as those found in integrated circuits and LSI circuits, circuit formation elements such as diffusion layers, polysilicon layers and aluminium layers have become necessarily microminiaturized in their demension.

In order to perform the operation analysis and fault analysis, it has generally been necessary to measure a potential on an electrode by mechanically contacting an Au wire on the electrode to be measured. With the microminiaturization of semiconductor elements, corresponding electrodes have become finer and finer, making it impossible to bring the Au wire into contact with the electrode. Even if contact is made between the wire and the electrode, an effect resulting from a capacitance formed between the wire and an electrode cannot be disregarded.

An electron beam tester (abbreviated hereinafter to an EB tester) has been developed to improve such drawbacks. The EB tester is constructed as shown, for example, in FIG. 1. An electron gun 3 including a cathode 1 and a pulse beam generator 2 is disposed in an airtight container 4. A deflection lens 5 is disposed on an electron beam path to deflect electron beams emitted from the electron gun 3.

The surface of a semiconductor element 6 which is beforehand placed in the container is scanned by the electron beam deflected by the deflection lens 5. If this is done, secondary electrons 7 are emitted from the semiconductor element 6. The secondary electrons 7 are deflected by deflection means 8 disposed on the beam incident side of the semiconductor element 6, and fall on a secondary electron multiplying section 10 through a retarding grid 9 (one kind of an energy filter).

When the semiconductor element 6 is operated under a scanning electronic microscope (SEM) while using the EB tester, it is possible to obtain a contrast corresponding to the level of a potential. This is what is called "a voltage contrast" phenomenon. If the potential of the electrode is lower, more secondary electrons are emitted and thus a brighter image is observed. Such contrast is qualitative to an appreciable extent. When the secondary electrons thus emitted are measured through a retarding grid (energy filter) 9, it is possible to measure a potential fairly quantitatively. Suppose that the semiconductor element 6 is driven by a proper power source (not shown) from the outside. If in this case the voltage on the retarding grid 9 is properly selected, the voltage on the semiconductor element can be measured with an accuracy of about 30 mV.

A semiconductor element such as a dynamic random access memory (d-RAM) takes a multilayered structure as shown in FIGS. 2 and 3 and the following problem arises in making measurement by the EB tester. As shown in FIG. 2 a diffusion layer (a data line) is formed in the surface of a semiconductor substrate 22 and an insulating layer 24 is formed on that surface portion of the substrate 22 which is located in the neighborhood of the diffusion region 23. A field oxide film is formed at each side of a combined configuration of the insulating layer 24 and diffusion region (data line) 23. First and second polysilicon layers 27 and 28 are formed on the insulating layer 24 with an insulating layer 26 therebetween, the insulating layer 26 being formed by a chemical vapor deposition method or a sputtering method. An insulating film 29 is formed by a chemical vapor deposition method or a sputtering method on the electrode 28. An aluminium layer (word line) 30 is connected to the diffusion region 23 and an insulating layer 31 is formed on the surface including the aluminium layer 30.

As a result, an $SiO_2$ layer of, for example, 2.4 $\mu$m is formed on the diffusion region 23 and first polysilicon layer 27, an $SiO_2$ of, for example, 1.8 $\mu$m is formed on the second polysilicon layer 28, and an $SiO_2$ layer of, for example, 1.0 $\mu$m is formed on the aluminium layer 30. The insulating layers are thickly formed on the respective interconnection layers 27, 28 and 30 and semiconductor substrate 22 and diffusion region 23, respectively, with a varying thickness.

If this structure is observed by an EB tester under a voltage contrast, a potential signal amount from each interconnection layer is influenced by the thickness of the $SiO_2$ layer covered on the interconnection layer. That is, the thicker the $SiO_2$ layer becomes, the more the potential signal amount is decreased. Even if, for example, the respective layers are all at the same potential level, the potential signal amount and contrast of the respective layer will vary.

It is very difficult, and entirely impossible in a quantitative way, to measure the potentials of, for example, the semiconductor substrate 22, diffusion region 23 and polysilicon layers 27, 28 by the EB tester.

SUMMARY OF THE INVENTION

It is accordingly an object of this invention to provide a semiconductor element which can accurately measure the potential of any desired potential measuring section by an EB tester by forming a probing pad made of an electroconductive material which electrically connected through a contact hole.

That is, this invention provides a semiconductor element characterized in that a probing pad made of electroconductive material is electrically connected through a contact hole such that the probing pad is at a level equal to, or higher than, the level of an uppermost interconnection layer.

According to this invention, since a probing pad made of electroconductive material is electrically connected through a contact hole, the semiconductor element of this invention is not entirely influenced by the thickness of an insulating layer of, for example, $SiO_2$ which is formed on the respective interconnection layer, assuring an accurate measuring of a potential on any desired potential measuring section of a semiconductor element by the EB tester.

DETAILED DESCRIPTION OF THE PREFERRD EMBODIMENT

Figure 1:
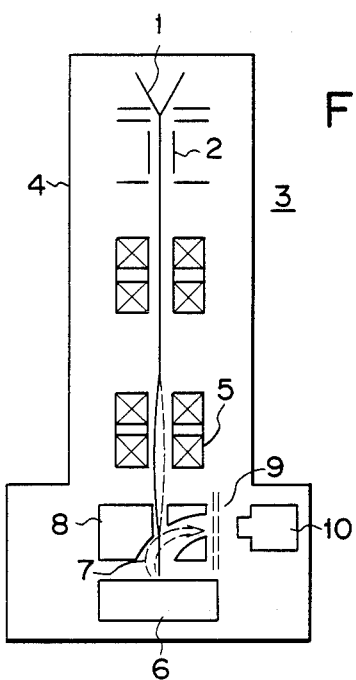
FIG. 1 is a schematic view for explaining an electron beam (EB) tester.
Figure 3:
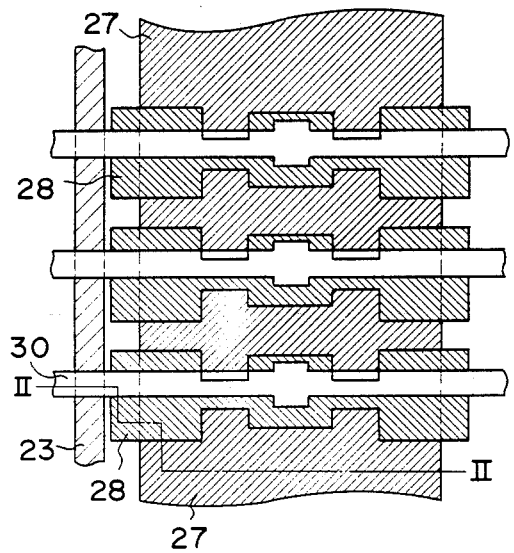
FIG. 3 is a plan view showing the structure of the conventional semiconductor element.
Figure 2:
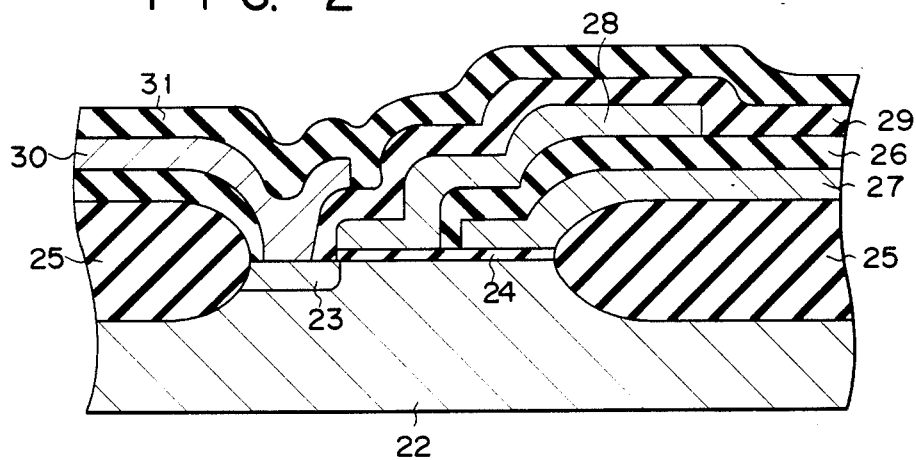
FIG. 2 is a cross-sectional view, as taken along line II—II, in FIG. 3, which explains the structure of a conventional semiconductor element.

One embodiment of this invention will be explained below by referring to the drawings. This embodiment is applied to a dynamic random access memory (d-RAM).

Figure 4:
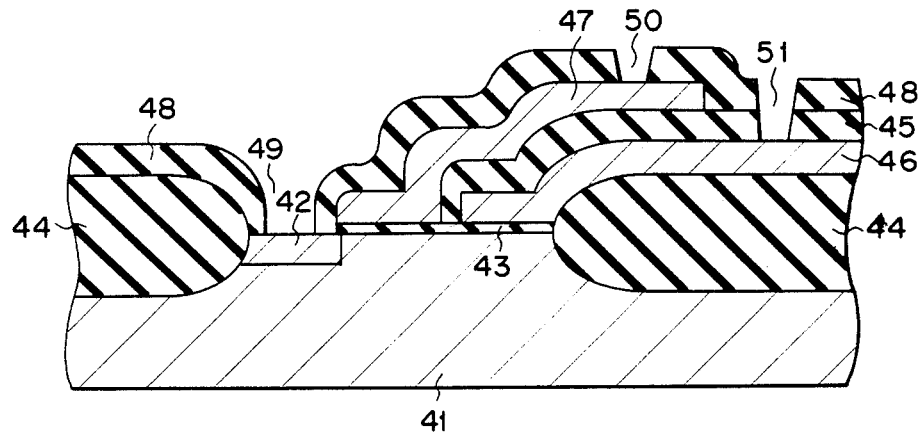
FIGS. 4 and 5 are cross-sectional views for explaining one embodiment of this invention.
Figure 5:
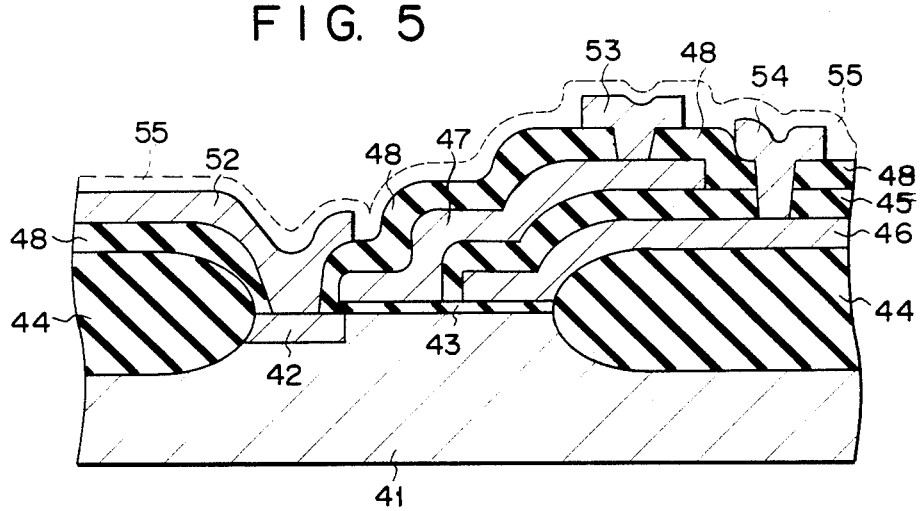

In FIGS. 4 and 5, a high concentration diffusion region 42 is formed by diffusing an N-type impurity in the surface of a semiconductor substrate, for example, a P-type silicon substrate 41, and an insulating layer i.e. an $SiO_2$ layer 43 is formed on that surface portion of the substrate 41 which is located close to the high concentration diffusion region 42. A field oxide film is respectively formed at left side of the diffusion layer 42 and right side of $SiO_2$ layer 43. First and second polysilicon layers 46 and 47 are formed, as gate electrodes, on the insulating layer 43 with an insulating layer 45 therebetween, the insulating layer 45 being formed by a chemical vapor deposition method or a sputtering method. An insulating film 48 is formed by a chemical vapor deposition method or a sputtering method on the second polysilicon layer 47. Contact holes 49, 51 and 50 are formed in any desired potential measuring sections, for example, the high concentration diffusion region 42 and first and second polysilicon layers 46 and 47. In this state, probing pads are formed as follows: An electroconductive material layer, for example, an aluminium layer is evaporated on the surface of a resultant structure and selectively etched away by a photoetching method to form an aluminium interconnection layer 52 as shown in FIG. 5. Probing pads 53, 54 of, for example, about 5 μm can be formed simultaneously with the deposition of the aluminium interconnection layer 52. Alternatively, the step of forming probing pads 53 and 54 may be performed separately, i.e. after the deposition of the aluminium interconnecting layer 52. In this case, the aluminium interconnection layer 52 is first vapor-deposited on a prescribed portion including the contact hole 49. Then contact holes 50 and 51, and the contact hole over the layer 52 are perforated through an insulation layer or layers. Finally the probing pads (53, 54 and etc.) are vapor-deposited over the contact holes (50, 51 and etc.).

Since, in the semiconductor element so constructed, probing pads for EB tester which are made of electroconductive material are electrically connected to the first and second polysilicon layers 46 and 47, it is possible to accurately measure potentials on the first and second polysilicon layers 46 and 47 by the EB tester.

The probing pads for the EB tester can be formed by photoetching, for example, at a dimension of below 10 $\mu m^2$ preferably below 5 $\mu m^2$.

Although in the above-mentioned embodiment the probing pads are electrically connected to the first and second polysilicon layers 46 and 47, it goes without saying that a probing pad for the semiconductor substrate or electroconductive region can be formed on the semiconducter element. An insulating layer 55 may be deposited such that it covers the probing pad uniformly as indicated by dotted lines in FIG. 5. This is effective in cases where the material such as Al of which the probing pad is formed is oxidized to form an insulating film whereby a constant reproducibility of a measuring value is assured. In this case, the thickness of the deposited insulating layer is preferred to be less than 5,000 Å. More preferably the thickness of the deposited insulating layer is between about 1,000 and about 2,000 Å.

The probing pad may be made of Al, Al alloy such as Al-Si and Al-Si-Cu, high melting point metal silicide such as $MoSi_2$ and $WSi_2$, polysilicon, Au or any similar material. Each of the probing pads to be formed on a single semiconductor element should be made of the same material, preferably the same metal, and formed at substantially the same level and by the same step. Although the above description of the invention has been with respect to a semiconductor element having a polysilicon gate in connection with the embodiment, it should be understood that the same effect can be obtained with respect to a semiconductor element having a gate of the silicide of a metal such as molybdenum.

Also this invention is not limited to only d-RAMS, but can be applied to semiconductor elements in any multi-layered structure.

What we claim is:

1. A semiconductor element comprising interconnection layers at various levels a pad for providing a contact with an exterior electrical connection and a probing pad for measuring the potential of a desired potential measuring section of an interconnection layer within said semiconductor element; said probing pad being made of electroconductive material; said probing pad being electrically connected through a contact hole to said desired potential measuring section of an interconnection layer covered with a first insulating layer; said probing pad being disposed at a level equal to, or higher than, an uppermost interconnection layer and isolated from other interconnection layers except said first-mentioned interconnection layer; and said probing pad being completely covered with a second insulating layer.

2. The semiconductor element of claim 1, wherein said second insulating layer has a uniform thickness of below 5,000 Å and is formed on said probing pad.

3. The semiconductor element of claim 2, wherein the thickness of said second insulating layer is between about 1,000 and about 2,000 Å.

* * * * *